(12) United States Patent
Gloger

(10) Patent No.: US 8,666,134 B2
(45) Date of Patent: Mar. 4, 2014

(54) METHOD FOR THE FULLY AUTOMATIC SEGMENTATION OF AN ORGAN, IN PARTICULAR THE RENAL PARENCHYMA, FROM VOLUME DATA SETS IN MEDICAL IMAGING

(75) Inventor: Oliver Gloger, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 128 days.

(21) Appl. No.: 13/440,677

(22) Filed: Apr. 5, 2012

(65) Prior Publication Data

US 2012/0257805 A1  Oct. 11, 2012

(30) Foreign Application Priority Data

Apr. 6, 2011  (DE) .......................... 10 2011 006 817

(51) Int. Cl.
*G06K 9/00*   (2006.01)

(52) U.S. Cl.
USPC ......................................................... 382/128

(58) Field of Classification Search
USPC .......................... 382/128–134; 128/920–925;
356/39–49; 600/407–414, 424–426;
345/581–618; 250/455
See application file for complete search history.

(56) References Cited

U.S. PATENT DOCUMENTS

2011/0044523 A1   2/2011   Gloger

FOREIGN PATENT DOCUMENTS

DE   102009038436 A1   2/2011

OTHER PUBLICATIONS

Leventon et al.; Statistical Shape Influence in Geodesic Active Contours Leventon et al.; CVPR. (2000) 1316-1323; Others; 2000.
Tsai, et al.; IEEE Transactions on Medical Imaging, vol. 22, No. 2, Feb. 2003; Others; 2003; US.
Zahn Charles et al: "Fourier Descriptors for Plane Closed Curves", SLAC-PUE-0850 (Rev), Aug. 1971; Others; 1971.
Cremers, Daniel et al: "Kernel Density Estimation and Intrinsic Alignment for Shape Priors in Level Set Segmentation", International Journal of Computer Vision 69 (3), pp. 335-351, 2006; Others; 2006.
Yuksel, S.E. et al: "A Kidney Segmentation Framework for Dynamic Contrast Enhanced Magnetic Resonance Imaging", http://jvc.sagepub.com; Journal of Vibration and Control 2007; 12; 1505; Others; 2007.
Kohlberger, T. et al: "Organ Segmentation with Level Sets Using Local Shape and Appearance Priors"; Siemens Corporate Research, Imaging and Visualization Dept., Princeton, USA;Siemens Healthcare Molecular Imaging, Oxford, UK; Clinic Generale-Beaulieu, Geneva, Switzerland; Others, 2009.
Caselles, V. et al: "Geodesic Active Contours"; To appear: International Journal of Computer Vision; Others, 1997.

(Continued)

*Primary Examiner* — Atiba O Fitzpatrick

(74) *Attorney, Agent, or Firm* — Harness, Dickey & Pierce, P.L.C.

(57) ABSTRACT

A method is disclosed for segmenting an organ from volume data sets in medical imaging. A likelihood data set is generated. A binary data set is generated with the aid of a threshold value method, in which the organ region is eroded step by step. When the organ region is separated into a number of subregions, only one of the subregions, which is most likely to contain the organ, is selected for further erosion in each instance. This subregion is identified from geometrical features of the organ, which are known from the training data sets. In the likelihood data set the likelihood values of voxels of the subregions separated in the binary data set are reduced, so that a correspondingly corrected likelihood data set results. On the basis of this corrected likelihood data set the organ from the likelihood data set is segmented.

19 Claims, 4 Drawing Sheets

(56) References Cited

OTHER PUBLICATIONS

Chan, T.F. et al: "Active Contours Without Edges", IEEE Transactions on Image Processing, vol. 10, No. 2, Feb. 2001: pp. 266-277; Others; 2001.

Gloger O, Kühn, J., Stanski, A., Völzke, H., Puls, R. A fully automatic three-step liver segmentation method on LDA-based probability maps for multiple contrast MR images. Magnetic Resonance Imaging 2010;28(6):882-897.; Others; 2010.

Kim D-Y, Park, J.-W. Computer-Aided Detection of Kidney Tumor on Abdominal Computed Tomography Scans. Acta Radiologica 2004;45(7):791-795.; Others; 2004.

Lin D-T, Lei,C.-C., Hung,S.-W. Computer-Aided Kidney Segmentation on Abdominal CT Images. IEEE Transactions on Information Technology in Biomedicine 2006;10(1):59-65; Others; 2006.

Pizer S, Fletcher, P.T., et.al. Deformable M-Reps for 3D Medical Image Segmentation. International Journal of Computer Vision 2003;55(2-3):85-106.; Others; 2003.

Rao M, Stough, J., Chi, Y.-Y., Muller, K., Tracton, G., Pizer, S.M., Chaney, E.L. Comparison of Human and Automatic Segmentations of Kidneys from CT images. International Journal of Radiation Oncology Physics 2005;61(3):954-960.; Others; 2005.

Tsagaan B, Shimizu, A., Kobatake, H., Miyakawa, K., Hanzawa, Y. Segmentation of Kidney by Using a Deformable Model. Oct. 7-10, 2001; Thessaloniki, Greece. p. 1059-1062; Others; 2001.

Spiegel M, Hahn, D.-A., Daum, V., Wasza, J., Hornegger, J. Segmentation of Kidneys Using a New Active Shape Model Generation Technique Based on Non-Rigid Image Registration. Computerized Medical Imaging and Graphics 2009;33(1):29-39.; Others; 2009.

Sun Y, Moura, J.-M., Yang, D., Ye, Q., Ho, C. Kidney Segmentation in MRI Sequences Using Temporal Dynamics. Nov. 7, 2002; Washington, USA. p. 98-101.; Book; 2002.

Sun Y, Moura, J.-M., Yang, D., Ye, Q., Ho, C. Subpixel Registration in Renal Perfusion MR Image Sequences. 2004; Arlington USA. Springer. p. 700-703.; Others; 2004.

Song T, Lee, V.-S., Rusinek, H., Wong, S., Laine, A.-F. Integrated Four Dimensional Registration and Segmentation of Dynamic Renal MR Images. Oct. 1-6, 2006; Copenhagen, Denmark. Springer. p. 758-765.; Others; 2006.

Wu C-H, Sun, Y.-N. Segmentation of Kidney from Ultrasound B-mode Images with Texture-based Classification. Computer Methods and Programs in Biomedicine 2006;84(2):114-123.; Others; 2006.

Völzke HA, D., Schmidt, C.O., Radke, D., Lorbeer, R., Friedrich, N.,Aumann, N., Lau, K., Piontek, M., Born, G., Havemann, C., Ittermann, T., Schipf, S., Haring, R., Baumeister, S.E., Wallaschofski, H., Nauck. M., Frick, S., Arnold, A., Jünger, M., Mayerle, J., Kraft, M., Lerch, M.M., Dörr, M., Reffelmann, T., Empen, K., Felix, S.B., Obst, A., Koch, B., Gläser, S., Ewert R., Fietze, I., Penzel, T., Dören, M., Rathmann, W., Haerting, J., Hannemann, M., Röpcke, J., Schminke, U., Tost, F., Rettig, R., Kors, J.A., Ungerer, S., Hegenscheid, K., Kühn, J.P., Hosten, N., Puls, R., Henke, J., Gloger, O., Teumer, A., Homuth, A., Völker, U., Schwahn, C., Holtfreter, B., Polzer, I., Kohlmann, T., Grabe, H.J., Rosskopf, D., Kroemer, H.K., Kocher, T., Biffar, R., John, U., Hoffmann, W. Cohort Profile: The Study of Health in Pomerania. International Journal of Epidemiology 2010;39(4).; Others; 2010.

Hussain HK, Chenevert TL, Londy FJ, Gulani V, Swanson SD, McKenna BJ, Appelman HD, Adusumilli S, Greenson JK, Conjeevaram HS. Hepatic fat fraction: MR imaging for quantitative measurement and display early experience. Radiology 2005;237:1048-1055.; Others; 2005.

Whitaker RT, Xue, X. Variable-conductance, Level-Set Curvature for Image Denoising. 2001; Thessaloniki, Greece. p. 142-145.; Others; 2001.

Ouyang Y-C, Chen, H.-H., Chai, J.-W., Chen, C.-C., Chen, C.,C.-C., Poon, S.-K., Yang, C.-W., Lee, S.-K. Independent Component Analysis for Magnetic Resonance Image Analysis. Journal on Advances in Signal Processing 2008;((Jan. 2008)):1-14.; Others; 2008.

Folkers A, Samet, H. Content-based Image Retrieval Using Fourier Descriptors on a Logo Database. 2002; Quebec City, Canada. p. 521-524.; Others; 2002.

Malladi RS, J.A. Level sets and fast marching methods in image processing and computer vision. In: Delogne P, editor.; 1996; Lausanne, Switzerland. p. 489-492.; Book; 1996.

Malladi R SJ, Vemuri B. Shape modelling with front propagation: a level set approach. IEEE Transactions on Pattern Analysis and Machine Intelligence 1995;17(2):158-174.; Others; 1995.

Kichenassamy S, Kumar, A., Olver, P., Tannenbaum A., Yezzi, A. Gradient flows and geometric active contour models. In: E. Grimson SS, A. Blake, and K. Sugihara, editor.; 1995; Massachusetts, USA. p. 810-815.; Others; 1995.

Chen Y, Tagare, H.D., Thiruvenkadam, S., Huang, F., Wilson, D., Gopinath, K.S., Briggs, R.W., Geiser, E.A.,. Using Prior Shapes in Geometric Active Contours in a Variational Framework. International Journal of Computer Vision 2002;50(3):315-328.; Others; 2002.

Rousson M, Paragios, N. Shape Priors for Level Set Representations. In: Heyden A, Sperr, G., Nielsen, M., Johansen, P., editor.; 2002; Copenhagen, Denmark. Springer.; Others; 2002.

Rousson M, Cremers, D. Efficient Kernel Density Estimation of Shape and Intensity Priors for Level Set Segmentation. In: Duncan JS, Gerig, G., editor.; 2005; Palm Springs, USA. Springer. p. 757-764.; Others; 2005.

Paragios N. A Level Set Approach for Shape-driven Segmentation and Tracking of the Left Ventricle. IEEE Transactions on Medical Imaging 2003;22(6):773-776.; Others; 2003.

Sussman M, Smereka, P., Osher, S. A level set approach for computing solutions to incompressible two-phase flow. Journal of Computational Physics 1994;114(1):146-159.; Book; 1994.

METHOD FOR THE FULLY AUTOMATIC SEGMENTATION OF AN ORGAN, IN PARTICULAR THE RENAL PARENCHYMA, FROM VOLUME DATA SETS IN MEDICAL IMAGING

PRIORITY STATEMENT

The present application hereby claims priority under 35 U.S.C. §119 to German patent application number DE 10 2011 006 817.1 filed Apr. 6, 2011, the entire contents of which are hereby incorporated herein by reference.

FIELD

At least one embodiment of the invention generally relates to a fully automatic method for segmenting an organ, in particular the renal parenchyma, from volume data sets in medical imaging, in particular from volume data sets in magnetic resonance tomography.

The segmentation of organs in image data sets from medical imaging is necessary both for clinical applications and for biomedical research. Manual segmentation and analysis is too time-consuming for epidemiological questions specifically. The most fully automatic methods possible must be used here, which allow 3D segmentation of the organ from the medical volume data sets so that an automatic calculation of the organ volume can then be undertaken. Many known segmentation techniques however still require interaction with a user in order to obtain a satisfactory segmentation result.

One particular problem is the segmentation of the renal parenchyma in volume data sets from magnetic resonance (MR) tomography. Until now this required MR volume data sets which were recorded during the administration of contrast agent, hereafter also referred to as contrast agent enhanced MR data sets, in order to obtain a satisfactory segmentation result.

S-E Yuksel et al., "A Kidney Segmentation Framework for Dynamic Contrast Enhanced Magnetic Resonance Imaging", Journal of Vibration and Control 2007, 13 (9-10):1505-1516, thus describe a method for kidney segmentation, in which prior knowledge of the kidney shape is used. A deformable model is used, which combines signed distance map densities with gray scale value distributions, which were calculated using an expectation maximization algorithm. However the method requires contrast agent enhanced MR data sets.

Known from T. Kohlberger et al., "Organ Segmentation with Level Sets Using Local Shape and Appearance Priors", in: Guang-Zhong Yang et al., editor, 2009, London, UK, Springer, 34-42, is a method for segmenting the kidney in data sets from computed tomography (CT), using prior knowledge of the kidney shape in combination with a level set methodology.

The known methods for segmenting the renal parenchyma in MR data sets until now always required the recording of contrast agent enhanced image data sets. Native MR data sets could not be used until now. Methods for segmenting from CT data sets can however not be transferred without modification to MR data sets due to the different image characteristics. All the known techniques also require an interaction, which is not feasible for fully automatic segmentation for epidemiological studies.

SUMMARY

At least one embodiment of the present invention specifies a method for fully automatic segmentation of an organ, in particular the renal parenchyma, in volume data sets from medical imaging, which is also suitable for a fully automatic 3D segmentation of the organ from native MR data sets.

Advantageous embodiments of the method are the subject matter of the dependent claims or will emerge from the description which follows and the example embodiment.

BRIEF DESCRIPTION OF THE DRAWINGS

The proposed method is described again in more detail below based on an example embodiment in conjunction with the drawings, in which.

Figure 1:
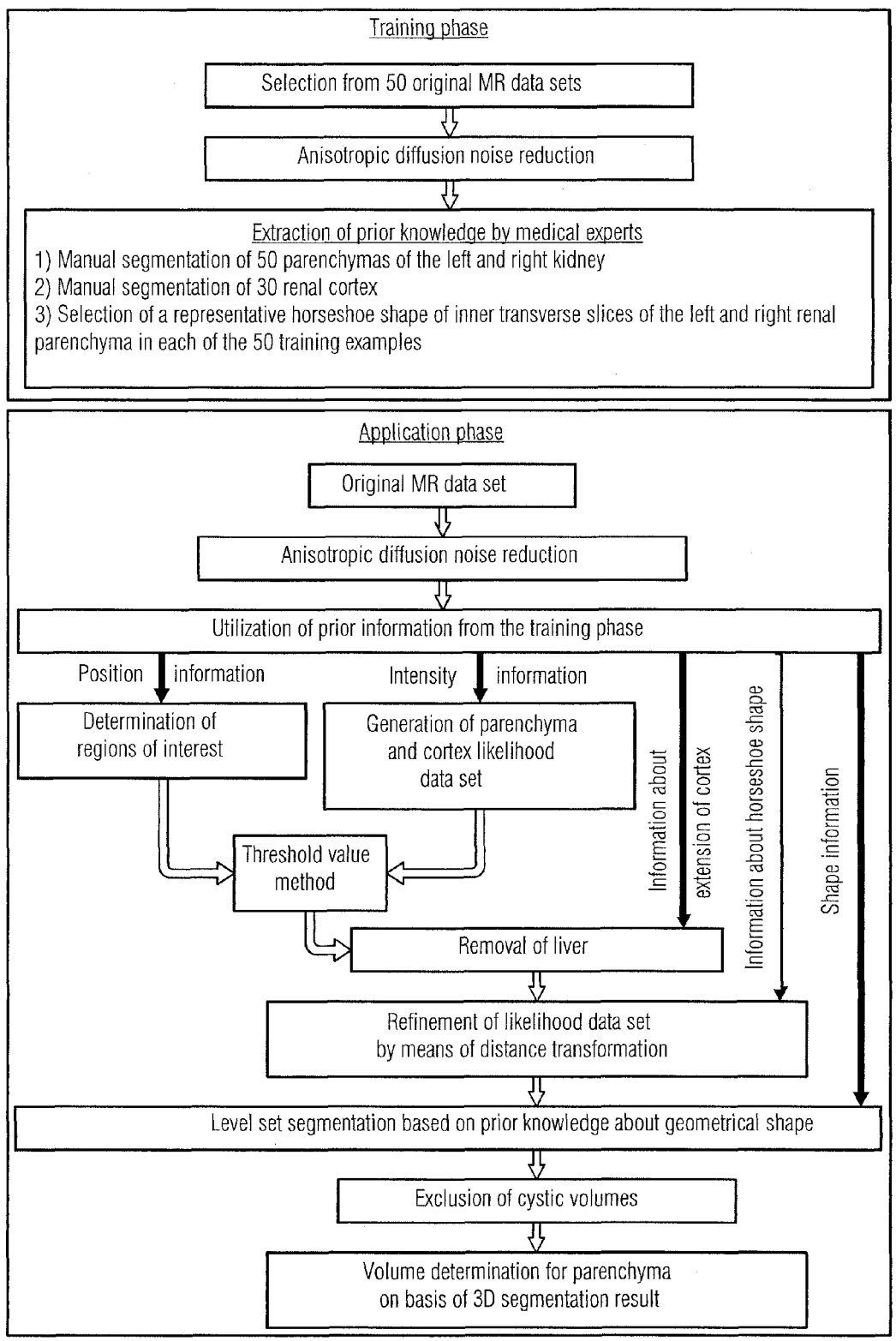
FIG. 1 shows a schematic diagram of the basic method sequence in one embodiment of the proposed method.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

With the proposed method of at least one embodiment, a region of interest of the volume data set to be segmented here, which contains the organ with the highest likelihood, is first determined on the basis of segmentation results from training data sets, which were obtained by manual segmentation of a plurality of volume data sets of different patients. A likelihood data set is also generated on the basis of the segmentation results from the training data sets using Bayes' theorem, in which likelihood data set a likelihood of being associated with the organ is assigned to every voxel of the volume data set to be segmented here on the basis of its intensity values. A threshold value method is applied to this likelihood data set in the region of interest, by which an organ region is isolated from the background in order to generate a binary data set, in which voxels of the background and voxels outside the region of interest have a different value from voxels of the organ region. The organ region here refers to the three-dimensional region which is very likely to contain the organ.

After the performance of this method step the voxels of the organ region in the binary data set for example have the value 1 and the remaining voxels have the value 0. A step by step erosion of the organ region is then performed in the binary data set. In every step of this erosion a slice of the region is removed starting from the remaining outer limit of the organ region in each instance. If such removal or erosion causes the organ region to split into a number of (sub)regions, only one of the regions, which is most likely to contain the organ, is selected for further erosion. Erosion is performed up to a predefinable number of steps, preferably with the aid of a signed distance function. The (sub)region which is most likely to contain the organ in each instance is hereby identified in at least one slice of the binary data set from geometrical features which are known from the training data sets. Thus for example during segmentation of the kidney the horseshoe shape of the kidney that can be identified in some slices can be used as a feature, allowing the region containing the kidney to be determined.

The step by step erosion therefore separates regions not associated with the organ, which are generally connected to the organ in the image or volume data sets by way of a narrow bridge. The separated regions are located in the likelihood data set and their likelihood values are reduced in this likelihood data set, in order thereby to increase the reliability of subsequent segmentation. Reducing the likelihood values of the separated regions in the likelihood data set produces a corrected likelihood data set. A segmentation technique is then used on the basis of this likelihood data set, to segment the organ from the corrected likelihood data set. Segmentation is also thus obtained from the corresponding volume data set. All the steps of the proposed method performed after the training phase can take place in a fully automated manner.

In one advantageous embodiment the number of erosion steps is stored for each separated (sub)region of the binary data set, after which number of steps separation of the respective region took place. The likelihood values of the voxels of these regions in the likelihood data set are then reduced by a factor, which is a function of the number of steps to separation of the respective region. In this process the likelihood values in regions separated after a smaller number of steps are reduced more than in regions separated after a higher number of steps.

In the erosion method step the region which is most likely to contain the organ is preferably identified from the geometrical 2D shape in one of the slices of the binary data set, by calculating a degree of similarity between the respective geometrical 2D shape obtained by erosion and a characteristic geometrical 2D shape of the organ created from the training data sets. The region with the highest degree of similarity is then further eroded in each instance.

During erosion therefore 3D regions forming oversegmentations are separated successively. In this process the 3D region, which contains the organ to be segmented, is identified in each instance. This technique preferably uses trained 2D shapes from characteristic slice regions of the organ, for example in the case of the kidney from the central transverse kidney regions, which have horseshoe-like shape characteristics. The spleen and thyroid gland also have characteristic 2D shapes for example in certain slice planes (frayed horseshoe shape or butterfly shape). Using the proposed method similar adjacent tissue structures, which have a minor degree of connectivity to the organ, are exposed. The knowledge collected allows this step to refine the likelihood data set and to provide an ideal starting surface for the preferably used final 3D level set segmentation as a result of successive 3D region separations.

The proposed method allows fully automatic 3D segmentation for example of the left and right renal parenchyma on native MR datasets. Fully automatic volumetry of the left and right renal parenchyma can also take place, which is particularly valuable for epidemiological and medical purposes. 3D segmentation also provides a 3D organ model of the relevant patient/subject, which can be used specifically for surgical purposes, for example to plan an operation or for certain consultation options in individualized medicine. The method can also be used for other data sets in medical imaging, for example data sets from computed tomography.

With the proposed method 3D segmentation preferably takes place by 3D level set segmentation, in which the surface of the region obtained after the last erosion step obtained from the binary data set is used as the initial zero level set, which is very likely to contain the organ. With this level set method 3D organ shapes trained in the known manner are used for segmentation. With the proposed method however segmentation is not performed on the volume data set, but on the corrected or refined likelihood data set obtained therefrom.

The existing level set segmentation is preferably supplemented here by a control characteristic to accumulate at the outer organ edges. To this end attraction forces are established within the level set segmentation, being defined with the aid of direction characteristics of the level set normal and the edge information. These defined accumulation or attraction forces assist and improve the segmentation quality of the proposed method. In the case of segmentation of the renal parenchyma a further likelihood data set is preferably generated to determine the edges or surface of the organ, containing the likelihoods with which the voxels of the volume data set are associated with the renal cortex. This likelihood data set is produced in the same manner as the likelihood data set for the renal parenchyma based on the training data sets with the aid of Bayes' theorem, with the renal cortex also having been segmented manually in the training data sets in this instance. The outer cortex edges are automatically determined in this data set and used as the outer limit or edges of the renal parenchyma in level set segmentation. A different data set can also be used instead of a likelihood data set to determine the edges.

Generally in this step outer edges of the organ are identified with the aid of scalar products, which utilize the direction information of the two gradient types, of the gradient of the likelihood values of the organ edge and of the gradient of the signed distance function. Forming the scalar product filters interfering edges out of the likelihood data set so that essentially only the organ edges are identified. These organ edges are then used to accumulate the zero level set with the aid of stop terms and attraction forces. The level set method used here is preferably a technique as described for example in the publication by D. Cremers et al., "Kernel Density Estimation and Intrinsic Alignment for Shape Priors in Level Set Segmentation", International Journal of Computer Vision 2006, 69 (3): 335-351, the entire contents of which are hereby incorporated herein by reference. This technique based on energy minimization is preferably supplemented with the above stop and attraction terms.

A further step to remove part of the liver is preferably performed before the erosion steps specifically for the application of segmentation of the renal parenchyma. A distance threshold value on the a-posteriori data set or likelihood data set of the cortex is determined here from the prior knowledge of an analyzed cortex thickness distribution of the kidney (from the training data sets). A specific distance transformation method is used here based on signed distance functions to remove the liver part from the positional likelihood space of the right kidney, to allow better subsequent segmentation. Details of this step can be taken from the example embodiment which follows.

The proposed method is described again in more detail below with reference to the segmentation of the renal parenchyma in native data sets from MR tomography. Additional method steps are performed to obtain an optimum segmentation result but these are not always necessary. Data acquisition and the training phase are also described but these are only preferably part of the proposed method. The proposed method uses the information from training data sets obtained in this manner.

In the example described here single-channel MR data sets of 50 subjects were recorded or selected and the renal parenchyma was manually segmented in these data sets. The binary masks of the left and right renal parenchyma were stored. The renal cortex in the left and right kidney was additionally segmented from 30 of these MR data sets, to obtain corresponding binary cortex masks. Binary renal medulla masks were also produced by subtracting the cortex masks from the parenchyma masks.

The two-dimensional horseshoe shape in the interior of the transverse slices of the left and right renal parenchyma is a characteristic geometrical feature of the renal parenchyma and is used for subsequent fully automatic segmentation. The corresponding slices of the training data sets, in which this horseshoe shape can be identified, are extracted by experts and stored separately. The corresponding geometrical shape is described by way of Fourier descriptors, as set out for example in C. Zahn et al., "Fourier descriptors for plane closed curves", IEEE Transactions on Computers 1972, 21 (3): 269-281, the entire contents of which are hereby incorporated herein by reference.

Since rotation and scaling differences between the horseshoe shapes of the different MR data sets are small, only the translationally invariant Fourier descriptors of the horseshoe shapes are stored, by setting their first Fourier descriptor to 0. Tissue-characteristic MR intensity distributions and the positions and shapes of the renal parenchymas in the data sets are produced from the segmented data. The kidney shape is represented by a trained signed distance function of the segmented regions and used in the subsequent level set segmentation. The thickness of the region representing the cortex is also determined from the 30 binary cortex masks produced.

FIG. 1 shows a schematic diagram of an overview of the proposed method, which in this example is divided into the training phase described above and the subsequent application phase. The application phase here comprises the following steps:

1. Determination of the regions of interest: the binary masks obtained from the training phase are combined to produce the regions of interest for the left and right kidney separately, in which the kidney is most likely to be contained. The subsequent segmentation of the renal parenchyma is performed in these regions of interest.

2. Generation of the likelihood data set: likelihood functions and a-priori likelihoods for tissue-specific intensities are derived from the training data and used for the calculation of a-posteriori likelihoods for parenchyma and cortex tissue. In this process a likelihood data set is generated for the parenchyma and a likelihood data set is generated for the cortex. These likelihood data sets are refined in the following steps and in their refined form are used as a basis for the subsequent level set segmentation.

3. Threshold formation: an empirically determined threshold value is used to isolate the parenchyma-type tissue regions in the regions of interest from the background. Binary data sets are generated as a result. The clearly differentiable likelihood values for the different tissue types mean that the same threshold value can be used to isolate cortex-type tissue in the likelihood data set for the cortex from the background.

4. Removal of a liver part: since the regions of interest generally contain part of the liver with intensities similar to those in the cortex regions, the expected thickness of the cortex is used to remove these liver regions.

5. Refinement of the likelihood data set on the basis of a distance transformation: an erosion process is used to isolate the parenchyma from other structures, with which it may be incorrectly associated. If regions are separated during erosion, the region that is most likely to contain the parenchyma is determined due to its characteristic horseshoe shape and further eroded. The likelihood values of the separated regions or segments are reduced in the likelihood data set by a factor which is a function of the type of connection between the separated segments. The eroded parenchyma shape also serves as a starting surface for the subsequent level set segmentation.

6. Level set segmentation using the information about the geometrical shape: the preceding steps improve the segmentation results and the information content of the data sets generated for the segmentation of the parenchyma but can still contain incorrect segmentations. Therefore in the level set segmentation the refined likelihood data set as a data term is combined with a form term. The form term utilizes the prior knowledge about the three-dimensional shape of the parenchyma, as contained in the parenchyma masks obtained in the training phase.

7. Exclusion of cystic volume: even though the likelihood values for cystic parenchyma tissue should be low, the form term can cause the segmentation still to contain cysts. A threshold value technique is therefore used, to isolate cystic parenchyma tissue from healthy parenchyma tissue. The threshold value is selected in the same manner as the threshold value from step 3.

8. Parenchyma volumetry: the segmentation result represents a binary mask, which can be used for an interpolated surface generation. The result is shown on the original MR volume data sets that can be visualized slice by slice, to analyze segmentation quality. The parenchyma volume can then be calculated easily with the aid of the 3D segmentation results.

These individual steps are examined in more detail in the following.

Figure 2:
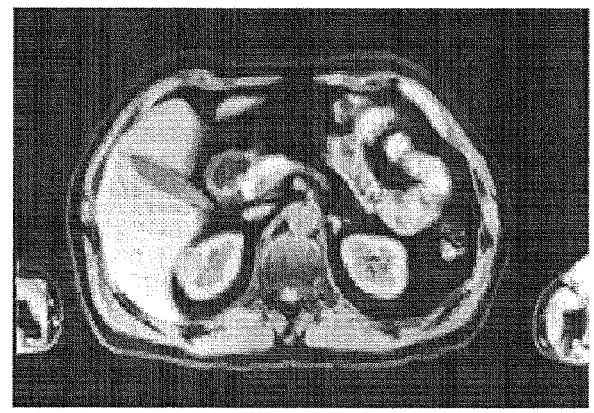
FIG. 2 shows a transverse MR slice image after noise reduction, showing the two kidneys.

For noise suppression in the recorded MR volume data set an anisotropic diffusion producing edges is preferably performed to homogenize the MR intensities within the different tissue types and to produce the edges that are important for differentiation between the different tissue types (cortex and renal medulla). Such noise-reduced MR volume data sets with fat-saturated weighting are used for the method, as these provide the best differentiation between renal medulla and cortex. FIG. 2 shows an example of a slice of such an MR volume data set after noise reduction, in which the left and right kidney can be identified.

Figure 3:
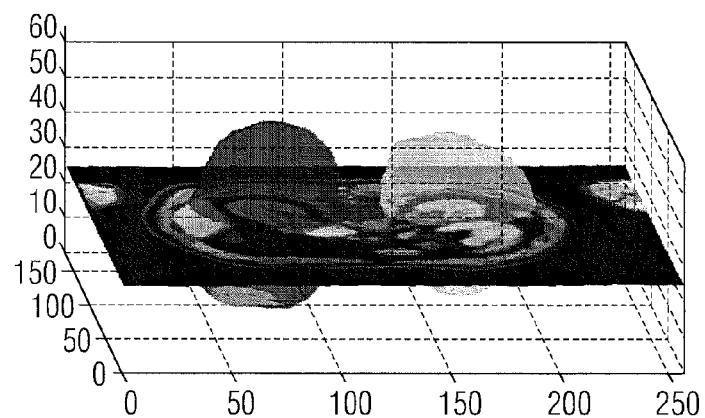
FIG. 3 shows an example of the regions of interest for left and right kidney.

During image recording in the training phase and the subsequent recording of the volume data set to be segmented, the subjects are positioned in a similar manner in the tomography system. This means that the kidney positions are in similar places in the respective MR data sets. The parenchyma masks obtained in the training phase are used to determine two regions of interest for the left and right kidney, which are most likely to contain the kidney. FIG. 3 shows an example of these regions of interest in respect of a slice image.

To generate the likelihood data sets P from the recorded volume data set, the MR intensities are divided into two classes rpc (renal parenchyma) and bg (background). Likelihood functions p(I|rpc) and p(I|bg) are estimated using a Gaussian kernel estimator from the intensity histograms of the training data. According to Bayes' theorem then:

$$P_{rpc} = P(rpc \mid I) = \frac{p(I \mid rpc) \times pr(rpc)}{p(I \mid rpc) \times pr(rpc) + p(I \mid bg) \times pr(bg)},$$

where I=I(x, y, z) corresponds to the MR intensity at position (x, y, z) in the MR volume data set. The a-priori likelihoods pr (rpc) of the parenchyma and pr (bg) of the background are determined by determining their ratios in the regions of interest of the binary masks obtained from the training phase.

To remove the liver component in the next step the cortex likelihoods are also required. These are calculated from the segmented cortex masks (ctx) and renal medulla masks (mdl) of the training phase. The a-priori likelihoods pr (ctx), pr (mdl), pr (bg) are estimated according to their occurrence in the complete MR volume data set, since for liver removal this is not possible just based on the regions of interest.

$$P_{ctx} = P(ctx \mid I) = \frac{p(I \mid ctx) \times pr(ctx)}{p(I \mid ctx) \times pr(ctx) + p(I \mid mdl) \times pr(mdl) + p(I \mid bg) \times pr(bg)}$$

Figure 4:
FIG. 4 shows a slice of the likelihood data set of the renal parenchyma in the regions of interest, (high likelihoods in each instance in white)
Figure 5:
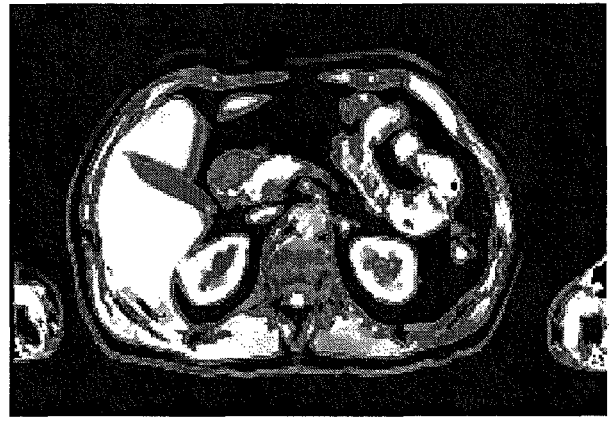
FIG. 5 shows a slice of the likelihood data set of the renal cortex (high likelihoods in each instance in white)

FIG. 4 shows a slice image of the generated likelihood data set Prpc of the parenchyma in the regions of interest. FIG. 5 shows a slice of the likelihood data set Pctx of the cortex. High likelihoods are shown in each instance here in white.

The liver and the renal cortex have similar intensities in the MR volume data sets. Since the liver is the largest abdominal organ, the maximum cortex thickness can be assumed to be less than the spatial extension of the liver. From the training phase the maximum cortex thickness was estimated at U=14 mm. The necessary morphological information is generated by applying a distance transformation to the segmented foreground voxels.

Pctx is subjected to a threshold value method, to generate a binary cortex mask Mctx (x, y, z). An implicit signed distance function dctx (x, y, z) is calculated for Mctx (x, y, z). The signed distance function includes positive distance values within and negative distance values outside the corresponding region. The upper limit U of the cortex distances is used as a threshold value for the distance function dctx:

$$M_{elr}(x, y, z) = \begin{cases} 1, & d_{ctx}(x, y, z) > U \\ 0, & \text{otherwise} \end{cases}$$

The mask Melr represents an eroded liver region and is 0 for voxels of the renal cortex. Another signed distance function delr (x, y, z) is then calculated on the basis of the limit of Melr (x, y, z). After adding the previously subtracted distance U and threshold value formation for delr (x, y, z)

$$M_{lr}(x, y, z) = \begin{cases} 1, & d_{elr}(x, y, z) > -U \\ 0, & \text{otherwise} \end{cases}$$

the mask Mlr (x, y, z) is calculated, which approximates to the liver region. Then Mlr (x, y, z) is subtracted from Mctx (x, y, z) and the liver region is removed from the likelihood data set for the parenchyma by corresponding masking.

Figure 6:
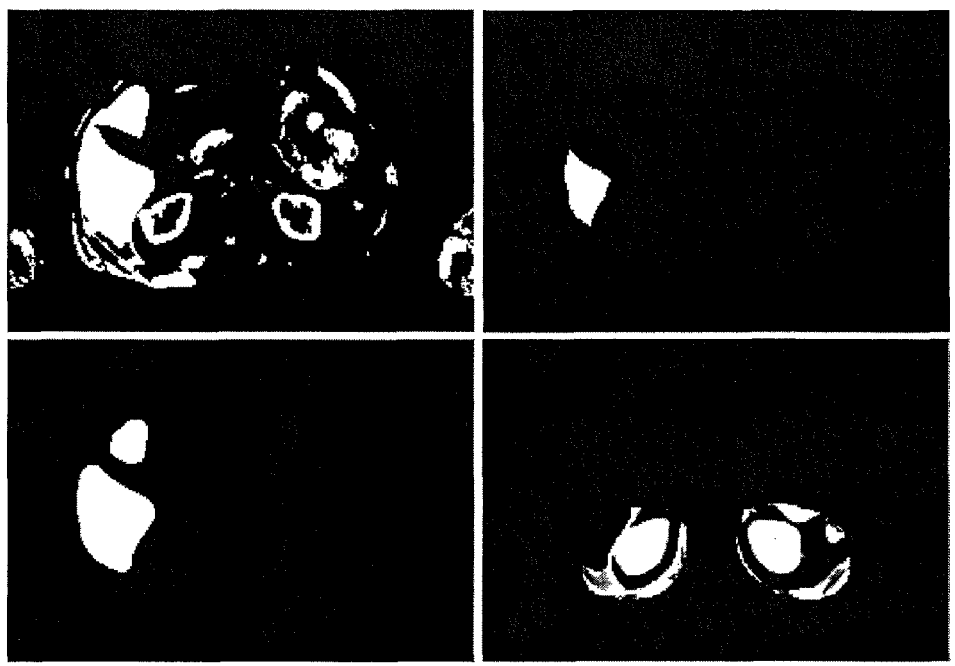
FIG. 6 shows an example of the function Mctx (top left), Melr (top right) and Mlr (bottom left) for a selected transverse slice and the result after separation of the liver part (bottom right)

FIG. 6 shows an example of the function Mctx in the top left part, where a threshold value of 0, 8*max(Pctx) was used. The top right part of the figure shows Melr, the bottom left part shows Mlr for a selected transverse slice. The bottom right part shows the result of the likelihood data set of the parenchyma in this slice after the removal of the liver part within the respective regions of interest.

This step refines the likelihood data set of the parenchyma. It also prevents any overlap with the liver parts in the subsequent level set segmentation.

Even after liver removal the intensity distribution for the renal parenchyma is not yet clear and application of a threshold value technique to the Prpc likelihood data set can still produce incorrect segmentations. Therefore with the proposed method an additional morphological operation is performed, in which the likelihood values of subregions which are very likely not to be associated with the parenchyma are reduced. The differing geometrical shapes, organ sizes and abdominal fat components of the subjects mean that the nature of the surface contact between their abdominal organs can be very different. Transition regions between the kidney and adjacent organs or tissue types are however always identified by small bridge-type structures. The purpose of the morphological operation used here is to break up the current estimated structure at such points. Information about the geometrical shape or other geometrical features of the organ to be segmented is then used to decide which subregions or subvolumes are most likely to contain the renal parenchyma.

Once a signed distance function has been generated on the basis of the binary likelihood data set for the parenchyma, obtained by applying a threshold value technique to Prpc, the current limit of the volume containing the parenchyma is eroded step by step in steps of 1 mm. After every erosion or shrinkage step it is checked whether the rpc volume has been separated into a number of subvolumes. If so, then characteristic geometrical attributes of the parenchyma are used to decide which of these separated subvolumes is most likely to represent the rpc volume. Only the most likely volume or the most likely region is further eroded. Erosion is terminated after twelve steps, so that this technique can be used to remove contact bridges which are maximum 24 mm wide. The concave shape of the renal parenchyma makes this upper limit necessary for erosion, to prevent separation within the renal parenchyma.

In the present example a two-dimensional geometrical feature of the renal parenchyma, namely its horseshoe-like shape in most transverse slices, is used to decide which of the respectively separated subvolumes or subregions after an erosion step is most likely to contain the renal parenchyma. In the training phase a number i=1 . . . 50 horseshoe shapes was generated for this purpose, being represented by vectors Fi of Fourier descriptors. Fourier descriptors Fjk are now calculated for every two-dimensionally connected component j in all the slices of all the subvolumes k. Since the geometrical shapes of the renal parenchyma obtained after applying the threshold value technique may contain the renal pelvis, a two-dimensional morphological erosion process is performed with a small disk-shaped structural element (3×3) for every two-dimensionally connected component, before its Fourier descriptors are determined. These structural elements are used so that small oversegmentations (e.g. in the renal pelvis, see top row in FIG. 7, right kidney), which could in some instances impede shape recognition, can be disregarded for this specific shape comparison.

The similarity D (Fi, Fjk) is then calculated as the square sum of the difference between the Fourier descriptors:

$$D(F_i, F_{jk}) = |F_i - F_{jk}|^2$$

The mean dissimilarity Dmean (Fjk) of all trained Fi, i=1 . . . 50 to Fjk is then calculated as $$D_{mean}(F_{jk}) = \frac{1}{M} \cdot \sum_{i=1}^{M} D(F_i, F_{jk})$$

If Dman (Fjk) is below a predefined threshold value (in this instance: 1.0), it is assumed that the corresponding slice is associated with the 3D volume k, in which the renal parenchyma is located. The 3D volume with the most slices to which this applies is assumed to be the most likely 3D volume, in which the renal parenchyma is located in this erosion stage. For all other subvolumes the number of erosion steps required to separate the respective subvolume is stored.

Figure 7:
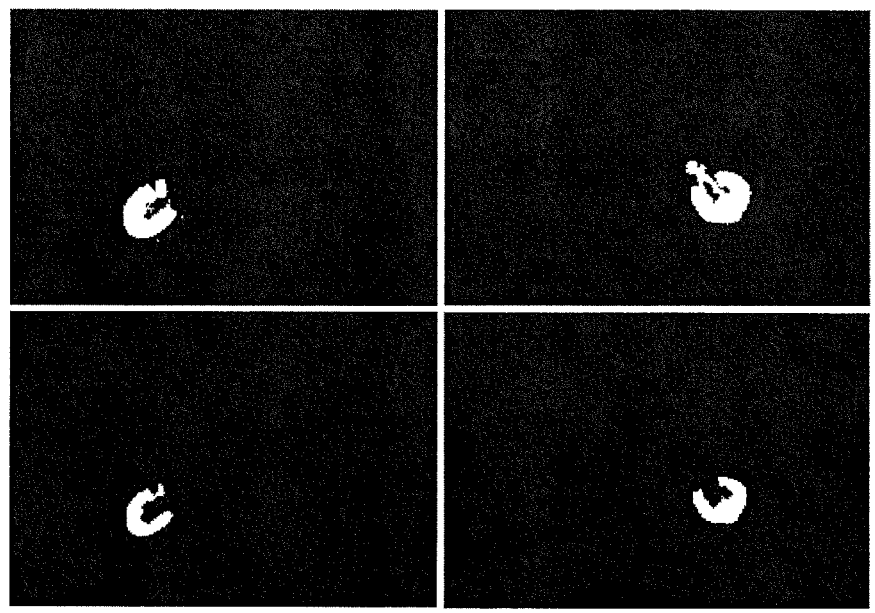
FIG. 7 shows an example of the horseshoe-shaped geometries of inner transverse kidney slices for left and right kidney (top row) and slightly eroded shapes (bottom row)

The top row of FIG. 7 shows an example of the horseshoe shape of the left and right kidney in transverse slices. The bottom row shows slightly eroded shapes, as occur with the proposed erosion, with the dissimilarity values Dmean in these instances between the shapes in the bottom and top rows being 0.67 (left kidney) and 0.36 (right kidney).

After the erosion steps the likelihood values in the likelihood data set Prpc are modified on the basis of this information. In this process hard assignments of the subvolumes or subregions to the renal parenchyma or to non-parenchyma tissue are avoided; the likelihood values are simply modified. The region separations between the renal parenchyma and the non-parenchyma tissue occur more often in the first steps of the erosion algorithm, since different tissue types are often connected by thin bridge-type structures. Therefore with the proposed method a function is used, which attenuates the renal parenchyma likelihood values at the positions of the separated regions according to the erosion or shrinkage distance, at which the separation occurred. For every separated 3D region or subvolume L the following function attL is applied for the distance-based attenuation of the likelihood values in the likelihood data set Prpc of the parenchyma:

$$att_L(x, y, z) = \begin{cases} \left(\frac{asd}{msd}\right)^2, & L(x, y, z) = 1 \\ 1, & L(x, y, z) = 0 \end{cases}$$

The factor asd here represents the erosion depth as a function of the selected step width at which the separation of the corresponding 3D region takes place. The factor msd represents the maximum erosion depth used to prevent separations within the kidney. Multiplying the likelihood values for the respective 3D regions L by the factor attL in the likelihood data set of the parenchyma gives a refined or corrected likelihood data set Pcrpc(x,y,z)=attL(x,y,z)×Prpc(x,y,z). In this refined likelihood data set 3D regions not separated when the maximum erosion depth msd was reached are not attenuated. Regions separated within this erosion depth are however attenuated according to the erosion depth at which they were separated.

Figure 8:
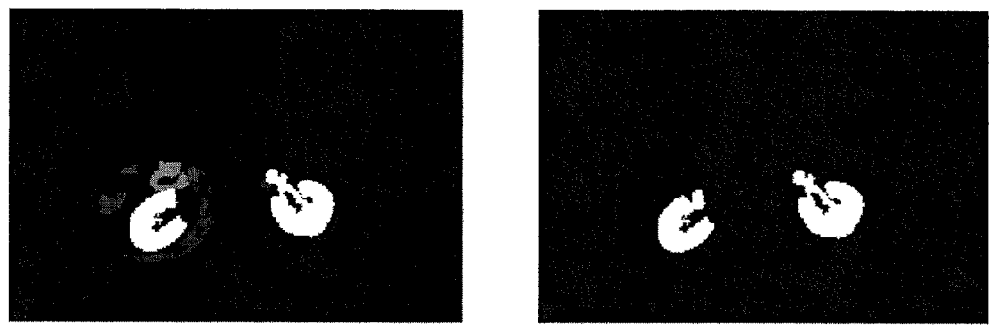
FIG. 8 shows a transverse slice of Pcrpc (left) and the remaining 3D regions in the left and right region of interest after the last erosion step (right).

The right-hand image in FIG. 8 shows the remaining volumes respectively in the region of interest after performing the erosion steps. The left-hand image shows the corresponding slice of the refined or corrected likelihood data set, in which the likelihood values of the separated regions have been reduced correspondingly.

This corrected likelihood data set Pcrpc (x,y,z) is now used as image data-relevant information for the following 3D level set segmentation. A level set segmentation based on prior information about the geometrical shape is hereby used, combining Pcrpc data information with prior information about the geometrical shape of the 3D parenchyma, which is contained in the parenchyma masks of the training phase. The inclusion of prior information about the geometrical shape accelerates the segmentation process and reduces the number of local minima, which do not represent the desired segmentation result. Also the limit of the most likely rpc volume after the last erosion step is used as an initial zero level set for the 3D level set segmentation.

The level set method represents a flexible shape and surface propagation model, which can be used for 2D and 3D segmentation. In the present method shape representation based on kernel density estimation is used in combination with the proposed energy minimization strategy. This technique is based on the abovementioned publication by Cremers et al. They use an energy functional, which includes a shape term Eshape and an image-related term Eimage as energy functionals, where α is a weighting parameter, to guide the influence of the prior information about the shape and the image information during the segmentation process:

$$E(\phi) = \alpha \cdot E_{image}(\phi) + E_{shape}(\phi)$$

In the present example the image-related term is replaced by a region-related functional, as known for example from T. F. Chan et al., "Active contours without edges", IEEE Transactions on Image Processing 2001, 10(2): 266-277, the entire contents of which are hereby incorporated herein by reference. The shape energy is defined as a translationally and scaling invariant shape similarity formulation by way of Heaviside functions of form-related signed distance functions Φ. The translational invariance is performed by intrinsic adjustment based on centers of gravity of shapes.

In the present example, as in the publication by Cremers et al., the following level set equation generated by gradient descent methods is used for the 3D segmentation of the renal parenchyma:

$$\frac{\partial \phi}{\partial t} = -\alpha \cdot \frac{\partial E_{Image}}{\partial \phi} - \frac{\partial E_{Shape}}{\partial \phi}$$

Instead of the original volume data set with the present method the refined likelihood data set Pcrpc is used to perform the segmentation. This refined likelihood data set allows automatic initialization of the level set segmentation. The surface, which after the last erosion step in the binary data set encloses the remaining rpc volume, serves as the initial zero level set for the signed distance function, as it represents an appropriate first estimation of the desired limit of the renal parenchyma. To accelerate the segmentation process, the level set segmentation is performed separately within the regions of interest for the left and right kidney.

To prevent movement of the zero level set in non-parenchyma tissue, with the present method additional functions or terms are introduced into the above equation for 3D segmentation of the renal parenchyma. These result in an adjustment to the outer cortex limit. Since other tissue can have higher cortex likelihood values, the most relevant edges of the cortex likelihood distribution must be filtered out. In the present method the normal directions of the level set are advantageously used for this purpose. After initialization of the zero level set surface the isonormals of the signed distance function are mainly aligned in direction within the kidney region. The relevant outer cortex limits OEctx from the likelihood data set Pctx for the cortex are extracted with the aid of the following scalar product:

$$OE_{ctx}(x,y,z) = \nabla \phi(x,y,z) \cdot (\nabla P_{ctx}(x,y,z))^T$$

$\nabla P_{ctx}$ here represents the gradients of the cortex likelihood distribution. The approximation of the zero level set to the desired segmentation result during propagation improves the filter effect of this scalar product incrementally, thereby emphasizing the cortex edges and suppressing edges of non-parenchyma tissue.

For the level set segmentation a stop function g is then formed, which ensures the stopping of the zero level set at the cortex edges. This stop function results in small values at the cortex edges and does not influence segmentation at non-cortex edges:

$$g(x, y, z) = \begin{cases} \exp(-OE_{ctx}(x, y, z))^2, & \exp(-OE_{ctx}(x, y, z)) < 1 \\ 1, & \text{otherwise} \end{cases}$$

An attraction force F is also defined, which draws the zero level set towards the filtered cortex edges, if the zero level set is close to said cortex edges. This is achieved by calculating the scalar product of the gradients of the signed distance function and the gradients of the stop function g:

$$F(x,y,z) = \nabla g(x,y,z) \cdot (\nabla \phi(x,y,z))^T$$

These two functions or terms are inserted into the equation for energy optimization so that the following equation is obtained for the level set propagation:

$$\frac{\partial \phi}{\partial t} = g(x, y, z) \cdot \left( \alpha \cdot \frac{\partial E_{ChanVese}}{\partial \phi} + \frac{\partial E_{Shape}}{\partial \phi} \right) + \beta \cdot F(x, y, z)$$

The factor β here is a weighting factor. In every propagation step the adjustment effect is updated by the stop function and the attraction function according to the current signed distance function.

Depending on the gradient directions, it may happen that initially non-cortex edges are also emphasized more at the start of the level set segmentation process. However during propagation the influence of these non-cortex edges in the stop function and the attraction function is reduced. Mainly due to the influence of shape optimization the zero level set converges towards the correct limits of the outer cortex. The direction differences between the two different gradient types at non-cortex edges grow during propagation, so that an attenuation of the scalar products results and correspondingly reduces the influence of the stop function and the attraction function at the non-cortex edges. This technique of additional stop and attraction terms improves the segmentation result considerably.

The proposed method allows a fully automatic 3D segmentation of the left and right renal parenchyma on MR data sets without contrast agent injection. Fully automatic volumetry of the left and right renal parenchyma can also take place, which is particularly valuable for epidemiological and medical purposes.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for segmenting an organ in volume data sets in medical imaging, wherein on the basis of segmentation results from training data sets, a region of interest is determined within a recorded volume data set which is most likely to contain the organ, and a likelihood data set is generated, wherein a likelihood of being associated with the organ is assigned to every voxel of the volume data set on the basis of its intensity values and the segmentation results from the training data sets, the method comprising:
   applying a threshold value method to the likelihood data set in the region of interest, by which an organ region is isolated from the background, in order to obtain a binary data set, in which voxels of the background and voxels outside the region of interest have a different value from voxels of the organ region,
   performing a step by step erosion of the organ region in the binary data set up to a predefinable number of steps, comprising
      removing, in every step starting from an outer limit of the organ region, a slice of the organ region,
      selecting, in the event of separation of the organ region into a number of subregions in one step, only one of the subregions which is most likely to contain the organ for the further erosion,
      wherein the subregion which is most likely to contain the organ is selected in each instance based on geometrical features in at least one slice of the binary data set, which are known from the training data sets,
   reducing, in the likelihood data set, the likelihood values of voxels of the subregions separated in the binary data set, so that a corrected likelihood data set results, and
   using, on the basis of the corrected likelihood data set, a segmentation technique to segment the organ from the likelihood data set and therefore also from the volume data set.

2. The method as claimed in claim 1, wherein the likelihood values of the voxels of the subregions separated in the binary data set are reduced in the likelihood data set by a factor, which is a function of the number of erosion steps to separation of the respective subregion, with the likelihood values in subregions separated after a smaller number of steps being reduced more than in subregions separated after a higher number of steps.

3. The method as claimed in claim 1, wherein the likelihood data set is generated by applying Bayes' theorem.

4. The method as claimed in claim 1, wherein the step by step erosion takes place with the aid of a signed distance function.

5. The method as claimed in claim 1, wherein the subregion that is most likely to contain the organ is identified from the geometrical 2D shape in at least one slice of the binary data set, by calculating a degree of similarity between the respective geometrical 2D shape obtained by erosion and a characteristic geometrical 2D shape of the organ created from the training data sets.

6. The method as claimed in claim 1, wherein in the case of segmentation of the renal parenchyma as an organ a further likelihood data set is generated, in which a likelihood of being associated with the renal cortex is assigned to every voxel of the volume data set on the basis of its intensity values and the segmentation results from the training data sets.

7. The method as claimed in claim 6, wherein
   a threshold value method is applied to the further likelihood data set in the region of interest, by which a cortex region is isolated from the background in order to generate a binary data set, in which voxels of the background and voxels outside the region of interest have a different value from voxels of the cortex region,
   a distance threshold value corresponding to a maximum cortex thickness is determined from prior knowledge of an analyzed cortex thickness distribution of the kidney from the training data sets, a liver region within the cortex region of the binary data set is identified with the aid of the distance threshold value based on a signed distance function in respect of the renal cortex, and the liver region is removed from the likelihood data set of the renal parenchyma before the step by step erosion is performed.

8. The method as claimed in claim 1, wherein a 3D level set segmentation is used as the segmentation technique, wherein prior information about the geometrical shape of the organ is used during segmentation, with the surface of the subregion obtained after all the erosion steps in the binary data set, which is most likely to contain the organ, being used as the first zero level set.

9. The method as claimed in claim 8, wherein the 3D level set segmentation takes place with the aid of a signed distance function Φ(x,y,z) with the following equation:

$$\frac{\partial \phi}{\partial t} = -\alpha \cdot \frac{\partial E_{image}}{\partial \phi} - \frac{\partial E_{shape}}{\partial \phi}$$

where $E_{image}$ is an energy functional representing the image content, $E_{shape}$ is an energy functional representing the geometrical shape of the organ and α is a weighting parameter.

10. The method as claimed in claim 8, wherein a stop function g(x,y,z) and an attraction function F(x,y,z) are also integrated in an equation for the 3D level set segmentation, with the stop function bringing about the stopping of the zero level set at an outer limit OE(x,y,z) of the organ and the attraction function bringing about an attraction force between this outer limit and the zero level set.

11. The method as claimed in claim 10, wherein the outer limit OE(x,y,z) of the organ is specifically calculated/extracted while at the same time suppressing inner organ limits from a scalar product of a gradient of the values contained in the likelihood data set or a further data set with this limit and of a gradient of a signed distance function Φ(x,y,z) for the organ.

12. The method as claimed in claim 10, wherein the stop function $$g(x, y, z) = \begin{cases} \exp(-OE(x, y, z))^2, & \exp(-OE(x, y, z)) < 1 \\ 1, & \text{otherwise} \end{cases}$$

is selected.

13. The method as claimed in claim 12, wherein the attraction function $$F(x,y,z)=\nabla g(x,y,z)\cdot(\nabla\phi(x,y,z))^T$$

is selected.

14. The method as claimed in claim 10, wherein the 3D level set segmentation takes place with the following equation:

$$\frac{\partial \phi}{\partial t} = g(x, y, z) \cdot \left( \alpha \cdot \frac{\partial E_{image}}{\partial \phi} + \frac{\partial E_{shape}}{\partial \phi} \right) + \beta \cdot F(x, y, z)$$

where $E_{image}$ is an energy functional representing the image content, $E_{shape}$ is an energy functional representing the geometrical shape of the organ and α and β are weighting parameters.

15. The method as claimed in claim 10, wherein in the case of a segmentation of the renal parenchyma the outer limit OE(x,y,z) of the organ is obtained from a scalar product of a gradient of the likelihood values contained in a likelihood data set for the renal cortex and of a gradient of a signed distance function Φ(x,y,z) of the organ.

16. The method of claim 1, wherein the method is for segmenting the renal parenchyma.

17. The method as claimed in claim 2, wherein the likelihood data set is generated by applying Bayes' theorem.

18. The method as claimed in claim 2, wherein the step by step erosion takes place with the aid of a signed distance function.

19. A non-transitory computer readable medium including program segments for, when executed on a computer device, causing the computer device to implement the method of claim 1.

* * * * *